United States Patent
Yano et al.

(10) Patent No.: US 7,906,777 B2
(45) Date of Patent: Mar. 15, 2011

(54) SEMICONDUCTOR THIN FILM AND METHOD FOR MANUFACTURING SAME, AND THIN FILM TRANSISTOR

(75) Inventors: Koki Yano, Sodegaura (JP); Kazuyoshi Inoue, Sodegaura (JP); Nobuo Tanaka, Sodegaura (JP); Tokie Tanaka, legal representative, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 255 days.

(21) Appl. No.: 12/093,827

(22) PCT Filed: Nov. 16, 2006

(86) PCT No.: PCT/JP2006/322809
§ 371 (c)(1),
(2), (4) Date: May 15, 2008

(87) PCT Pub. No.: WO2007/058232
PCT Pub. Date: May 24, 2007

(65) Prior Publication Data
US 2009/0267064 A1    Oct. 29, 2009

(30) Foreign Application Priority Data
Nov. 18, 2005 (JP) ................... 2005-334502

(51) Int. Cl.
*H01L 29/10* (2006.01)
(52) U.S. Cl. .............. 257/43; 438/658; 257/E29.289
(58) Field of Classification Search ............... 438/658; 257/43, E29.289
See application file for complete search history.

(56) References Cited

U.S. PATENT DOCUMENTS

| | | |
|---|---|---|
| 7,061,014 B2 | 6/2006 | Hosono et al. |
| 2003/0047785 A1 | 3/2003 | Kawasaki et al. |
| 2006/0108529 A1 | 5/2006 | Saito et al. |
| 2007/0209928 A1 | 9/2007 | Inoue et al. |

FOREIGN PATENT DOCUMENTS

JP    7-218460 A    8/1995
(Continued)

OTHER PUBLICATIONS

Toshihiro Moriga et al, "Transparent conducting amorphous Zn-Sn-O films deposited by simultaneous dc sputtering", J. Vac. SCI. Technology, 2004, vol. 22, No. 4, pp. 1705-1710.
H.Q. Chiang et al, "High mobility transparent thin-film transistors with amorphous zinc tin oxide channel layer," Applied Physics Letters, Jan. 3, 2005, vol. 86, No. 1, pp. 86,013503-1-86,013503-3.

(Continued)

*Primary Examiner* — Davienne Monbleau
*Assistant Examiner* — Matthew Reames
(74) *Attorney, Agent, or Firm* — Millen, White, Zelano & Branigan, P.C.

(57) ABSTRACT

The present invention provides a semiconductor thin film which can be manufactured at a relatively low temperature even on a flexible resin substrate. As a semiconductor thin film having a low carrier concentration, a high Hall mobility and a large energy band gap, an amorphous film containing zinc oxide and tin oxide is formed to obtain a carrier density of $10^{+17}$ cm$^{-3}$ or less, a Hall mobility of 2 cm$^2$/V·sec or higher, and an energy band gap of 2.4 eV or more. Then, the amorphous film is oxidized to form a transparent semiconductor thin film 40.

20 Claims, 1 Drawing Sheet

FOREIGN PATENT DOCUMENTS

| | | | |
|---|---|---|---|
| JP | 7-218460 | W | 8/1995 |
| JP | 2007-218460 | A2 | 8/1995 |
| JP | 2000-67657 | A | 3/2000 |
| JP | 2000-67657 | A2 | 3/2000 |
| JP | 2000-67657 | W | 3/2000 |
| JP | 2003086808 | A | 3/2003 |
| JP | 2006-165530 | W | 6/2003 |
| JP | 2004-103957 | A | 4/2004 |
| JP | 2004-103957 | A2 | 4/2004 |
| JP | 2004-103957 | W | 4/2004 |
| JP | 2004273614 | A2 | 9/2004 |
| JP | 2005290458 | A | 10/2005 |
| JP | 2006-165530 | A | 6/2006 |
| JP | 2006-165530 | A2 | 6/2006 |

OTHER PUBLICATIONS

Li, Guiliang (patent agent). "First Office Action." (State Intellectual Property Office of People's Republic of China.) Jul. 17, 2009, Application No. 200680042994.7, Applicant: Idemitsu Kosan Co., Ltd. Title of Invention: Semiconductor Thin Film and Method for Manufacturing Same, and Thin Film Transistor.

Moriga, Toshihiro et al. "Transparent Conducting Amorphous Zn-Sn-O Films Deposited by Simultaneous Dc Sputtering." Journal of Vacuum Science & Technology A vol. 22, No. 4 (2004): 1705-1710.

SEMICONDUCTOR THIN FILM AND METHOD FOR MANUFACTURING SAME, AND THIN FILM TRANSISTOR

TECHNICAL FIELD

The present invention relates to a semiconductor thin film made of an amorphous film containing zinc oxide and tin oxide, a method for manufacturing the same, and a thin film transistor using such a semiconductor thin film.

BACKGROUND ART

A field effect transistor is widely used as a unit electronic device of a semiconductor memory integrated circuit, a high-frequency signal amplification device, a liquid crystal drive device, or the like and is an electronic device which is most practically used at present.

Among the devices, with remarkable development of displays in recent years, a thin film transistor (TFT) is often used as a switching device for driving a display by applying a drive voltage to a display device in not only a liquid crystal display (LCD) but also various displays such as an electroluminescence display (EL) and a field emission display (FED).

As the material of the thin film transistor, a silicon semiconductor compound is used most widely. Generally, silicon single crystal is used for a RF amplification device, a device for an integrated circuit, and the like requiring high-speed operation. Amorphous silicon is used for a liquid crystal driving device or the like to address a demand for a larger area.

However, at the time of crystallizing a crystalline silicon thin film, a high temperature such as 800° C. or higher is necessary, so that it is difficult to form the crystalline silicon thin film on a glass substrate or an organic substrate. There are consequently problems such that a crystalline silicon thin film can be formed only on an expensive substrate having high heat resistance such as silicon wafer, quartz, or the like, and enormous energy and a number of processes are required for manufacture.

On the other hand, an amorphous silicon semiconductor (amorphous silicon) which can be formed at a relatively low temperature has a switching speed lower than that of a crystalline one. Therefore, when the amorphous silicon semiconductor is used as a switching device for driving a display, there is the case that the semiconductor cannot follow high speed display of a moving picture.

Further, when a semiconductor active layer is irradiated with a visible ray, it becomes conductive. There is the possibility such that a leak current is generated, and an erroneous operation is performed. A problem occurs such that the characteristics of the switching device deteriorate. There is known a method of providing a light shield layer for blocking the visible ray to address the problem. As the light shield layer, for example, a metal thin film is used.

However, when the light shield layer which is a metal thin film is provided, the number of processes increases and, in addition, floating potential is generated. It is consequently necessary to set the light shield layer to the ground level. In this case as well, a problem occurs such that parasitic capacitance is generated.

At present, as the switching device for driving the display, a device using a silicon semiconductor film is the mainstream for the reasons that various performances of silicon thin films such as high stability, high processability, and high switching speed are excellent. Such silicon thin films are manufactured generally by chemical vapor deposition (CVD) method.

There is a conventional thin film transistor (TFT) having an inversely-staggered structure in which a gate electrode, a gate insulating layer, a semiconductor layer made of amorphous silicon hydride (a-Si:H) or the like, and source and drain electrodes are stacked on a substrate made of glass or the like. In the field of a large-area device such as an image sensor, the conventional thin film transistor is used as a drive device of a flat panel display or the like typified by a liquid crystal display of an active matrix type. In those uses, as the functions become higher also in a conventional device made of amorphous silicon, higher operation speed is in demand.

Under such circumstances, in recent years, attention is being paid to a transparent semiconductor thin film made of a metallic oxide, particularly, a transparent semiconductor thin film made of a zinc oxide crystal as a film having stability higher than that of the silicon semiconductor thin film.

For example, a method of constructing a thin film transistor by crystallizing a zinc oxide at high temperature is described in Patent Documents 1 and 2, or the like. TFT (Thin Film Transistors) using an oxide thin film containing zinc or tin are described in Non-patent document 1.

Patent document 1: Japanese Unexamined Patent Application Publication No. 2003-86808

Patent document 2: Japanese Unexamined Patent Application Publication No. 2004-273614

Non-patent document 1: Applied Physics Letter 86, 013503 (2005)

DISCLOSURE OF THE INVENTION

Problems to be Solved by the Invention

However, it is difficult to industrialize a transparent semiconductor thin film made of such a metal oxide for reasons such that properties change depending on thermal history after film formation, an in-plane distribution is large, and reproducibility is poor. To improve the TFT characteristics such as field effect mobility, on-off ratio, and leak current, an extremely special gate insulating film made of super lattice crystal or the like stacked by ALD method has to be used. In this case, a process of manufacturing a gate insulating film becomes complicated, and there is the possibility that the film cannot be manufactured in a consistent process. It is also feared that adhesion to a metal gate wire is low or contact resistance occurs.

The present invention has been achieved in view of the circumstances. An object of the invention is to provide a semiconductor thin film which can be manufactured at a relatively low temperature even on a flexible resin substrate, having low carrier concentration, high Hall mobility, and a large energy gap, a method of manufacturing such a semiconductor thin film, and a thin film transistor using such a semiconductor thin film, having high field effect mobility, high on-off ratio, and improved device characteristics by reducing influence of radiation ray caused by generation of leak current or the like.

Means for Solving the Problems

A semiconductor thin film according to the present invention for solving the problems is made by an amorphous film containing a zinc oxide, and tin oxide and whose specific resistance is 10 Ωcm to $10^7$ Ωcm.

As the semiconductor thin film according to the invention having such a configuration, by making a zinc oxide and a tin oxide contained, an amorphous film can be easily manufactured in a wide temperature range. The amorphous film is suitable for uses of a display panel and the like since uniform properties are easily displayed in a large area.

In the semiconductor thin film according to the invention, when specific resistance becomes smaller than 10 Ωcm, at the time of constructing a device such as the thin film transistor 1, a leak current is generated, the device is normally on, and the on-off ratio decreases, so that excellent transistor performances cannot be displayed.

When the specific resistance is higher than $10^7$ Ωcm, there is the possibility that the threshold voltage of the thin film transistor 1 becomes high and an excessive voltage has to be applied at the time of driving.

In the semiconductor thin film according to the present invention, preferably, the film is a non-degenerate semiconductor thin film having a carrier density of $10^{+17}$ cm$^{-3}$ or less, a Hall mobility (charge mobility obtained by Hall measurement) of 2 cm$^2$/V·sec or higher, and an energy band gap of 2.4 eV or more.

In the semiconductor thin film according to the invention, when carrier density becomes higher than $10^{+17}$ cm$^{-3}$, at the time of constructing a device such as the thin film transistor 1, leak current is generated, the device is normally on, or the on-off ratio becomes low, so that excellent transistor performance may not be displayed.

If the Hall mobility is lower than 2 cm$^2$/Vs, the field effect mobility of the thin film transistor 1 becomes low. In the case of using the device as a switching device for driving a display device, there is the possibility that, in a manner similar to amorphous silicon, switching speed is low and the device cannot follow high-speed display of a moving picture.

If the energy band gap is smaller than 2.4 eV, when a visible ray is emitted, electrons in the valence band are excited, conductivity is displayed, and there is the possibility that a leak current is generated easily.

When a degenerate semiconductor is used, it is feared that the carrier concentration cannot be controlled stably to be low. The non-degenerate semiconductor thin film denotes a semiconductor thin film in which the carrier concentration changes depending on temperature. The temperature dependency of carrier concentration can be obtained from Hall measurement.

In the semiconductor thin film according to the present invention, preferably, atom ratio between zinc [Zn] and tin [Sn] in the amorphous film is expressed as Zn/(Zn+Sn)=0.40 to 0.95.

When the atom ratio [Zn/(Zn+Sn)] is lower than 0.40, the valence of tin that excessively exists changes, and it may be difficult to adjust the carrier density.

On the other hand, when the atom ratio [Zn/(Zn+Sn)] becomes higher than 0.95, the zinc oxide is partly crystallized, and there is the possibility that nonuniformity occurs in the characteristics.

In the semiconductor thin film according to the invention, preferably, transmittance of a wavelength of 550 nm is 75% or higher. In such a manner, also in the case that the semiconductor thin film is off to the pixel electrode part, or the semiconductor thin film and part or all of the pixel electrode part overlap each other, inconveniences such that the transmittance or luminance decreases and hue changes can be avoided effectively.

In the semiconductor thin film according to the invention, preferably, the work function is 3.5 to 6.5 eV. In such a manner, deterioration in the transistor characteristics caused by occurrence of leak current, energy barrier, or the like can be effectively avoided.

A method of manufacturing a semiconductor thin film according to the invention includes: a step of forming an amorphous film containing zinc oxide and tin oxide by physical film forming method; and a step of performing a post process in which temperature in a film surface in the presence of oxygen becomes a temperature equal to or higher than a substrate temperature at the time of the film formation.

By such a method, while controlling the carrier concentration in the semiconductor thin film, the semiconductor thin film as described above can be manufactured.

A thin film transistor according to the invention may be constructed by comprising a semiconductor thin film as described above.

Effects of the Invention

As described above, the present invention can provide a semiconductor thin film as a component of an excellent field effect transistor which can be formed on a glass substrate, a resin substrate, or the like in a wide temperature range, which is stable to a visible ray and hardly erroneously operates, and in which leak current is small. The semiconductor thin film of the present invention can be formed at a relatively low temperature. Consequently, by forming the semiconductor thin film on a resin substrate, a flexible thin film transistor or the like can be also provided.

DESCRIPTION OF REFERENCE NUMERALS

1 thin film transistor
40 transparent semiconductor thin film

BEST MODE FOR CARRYING OUT THE INVENTION

Preferred embodiments of the present invention will be described below.

First Embodiment

A first embodiment of a thin film transistor according to the present invention will be described.

Figure 1:
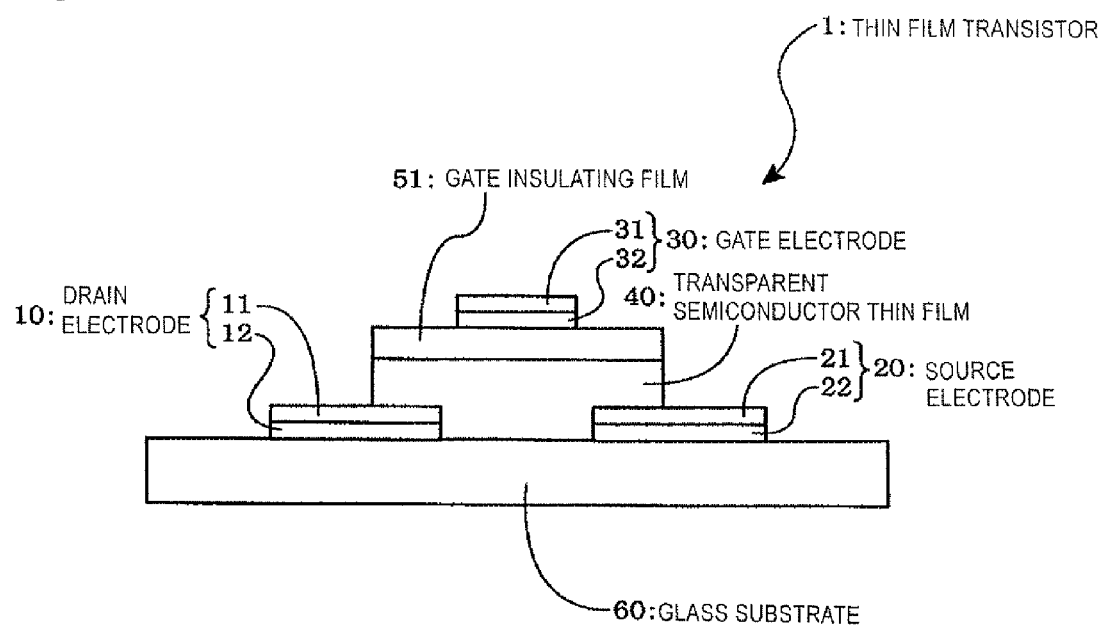
FIG. 1 is an explanatory diagram showing outline of a first embodiment of a thin film transistor according to the invention.

FIG. 1 is an explanatory diagram showing outline of the first embodiment of the thin film transistor according to the present invention.

In the example of the diagram, in a thin film transistor 1 as a field effect transistor, a drain electrode 10 and a source electrode 20 are formed so as to be apart from each other on a glass substrate 60, a transparent semiconductor thin film 40 is formed so as to be in contact with at least a part of each of the drain electrode 10 and the source electrode 20, and a gate insulating film 50 and a gate electrode 30 are formed in order on the transparent semiconductor thin film 40. In such a manner, the thin film transistor 1 is constructed as the thin film transistor 1 of a top gate type.

In the embodiment, as the substrate 60, any substrate which is generally used for a thin film transistor of this kind such as an Si wafer substrate, a glass substrate, or a resin substrate, can be used without limitation. However, it is preferable to use an Si wafer substrate or a glass substrate from the viewpoint of heat resistance.

The materials for forming the gate electrode 30, the source electrode 20, and the drain electrode 10 are not particularly limited. A material generally used can be arbitrarily selected without loosing the effects of the embodiment. For example, a transparent electrode made of ITO, IZO, ZnO, SnO2, or the like, a metal electrode made of Al, Ag, Cr, Ni, Mo, Au, Ti, Ta, or the like, or a metal electrode made of an alloy of any of the metals can be used.

Each of the gate electrode 30, the source electrode 20, and the drain electrode 10 may have a multilayer structure in which two or more different conductive layers are stacked. In the example shown in the diagram, the electrodes 30, 20, and 10 are constructed by first conductive layers 31, 21, and 11 and second conductive layers 32, 22, and 12, respectively.

The material for forming the gate insulating film 50 is not particularly limited. An arbitrary material generally used can be selected without loosing the effects of the invention of the embodiment. For example, an oxide such as $SiO_2$, $SiN_x$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, or the like can be used. Among them, it is preferable to use $SiO_2$, $SiN_x$, $Al_2O_3$, $Y_2O_3$, $Hf_2O_3$, and $CaHfO_3$, it is more preferable to use $SiO_2$, $SiN_x$, $Y_2O_3$, $Hf_2O_3$, and $CaHfO_3$, and it is particularly preferable to use $SiO_2$ and $SiN_x$. The oxygen number of any of the oxides may not always coincide with the stoichiometric ratio (for example, $SiO_2$ or $SiO_x$ may be used).

Such a gate insulating film 50 may have a structure in which two or more different insulating films are stacked. The gate insulating film 50 may be any of crystalline, polycrystalline, and amorphous material. Polycrystalline and amorphous material are preferable since they are easily industrially manufactured. The amorphous material is particularly preferable since it has good adhesion to a transparent semiconductor layer which is an amorphous film.

In the embodiment, the transparent semiconductor thin film 40 is made of an amorphous material containing zinc oxide and tin oxide and is formed to obtain a specific resistance of 10 to $10^7$ Ωcm, a carrier density obtained by Hall measurement of $10^{+17}$ cm$^{-3}$ or less, a Hall mobility of 2 cm$^2$/V·sec or more, and an energy band gap between a conduction band and a valence band of 2.4 eV or more.

The amorphous film containing zinc oxide and tin oxide is easily produced in a wide temperature range and, by forming an amorphous film, an uniform property is easily expressed in a large area. Consequently, the amorphous film is particularly preferable for the use of a display panel or the like.

From no appearance of a clear peak in X-ray diffraction, it can be confirmed that the film is an amorphous film.

When specific resistance is smaller than 10, at the time of constructing a device such as the thin film transistor 1, a leak current occurs, the device becomes normally on, or the on-off ratio becomes lower, so that excellent transistor performance cannot be displayed. On the other hand, when specific resistance is higher than $10^7$, there is the possibility that the threshold voltage of the thin film transistor 1 becomes high or fluctuates or an excessive voltage has to be applied at the time of driving.

To avoid such an inconvenience more effectively, the specific resistance is preferably $10^2$ to $10^6$ Ωcm and, more preferably, $10^3$ to $10^5$ Ωcm.

When the carrier density becomes higher than $10^{+17}$ cm$^{-3}$, at the time of constructing a device such as the thin film transistor 1, a leak current occurs, the device becomes normally on, or the on-off ratio becomes lower, so that excellent transistor performance cannot be displayed. To avoid such a inconvenience more effectively, the carrier density is preferably set to $10^{+16}$ cm$^{-3}$ or less, more preferably, $10^{+15}$ cm$^{-3}$ or less and, particularly preferably, $10^{+14}$ cm$^{-3}$ or less.

When the Hall mobility is smaller than 2 cm$^2$/Vs, the field effect mobility of the thin film transistor 1 becomes low. In the case of using the device as a switching device for driving a display device, there is the possibility that, in a manner similar to amorphous silicon, switching speed is low and the device cannot follow high-speed display of a moving picture. To avoid such an inconvenience more effectively, a Hall mobility is preferably set to 5 cm$^2$/Vs or higher, more preferably, 8 cm$^2$/Vs or higher, further more preferably, 11 cm$^2$/Vs or higher and, particularly preferably, 14 cm$^2$/Vs or higher.

By forming the transparent semiconductor thin film 40 having a carrier density of $10^{+17}$ cm$^{-3}$ or less and a Hall mobility of 2 cm$^2$/Vs or more, a novel excellent field effect transistor can be obtained. The transistor has a high field effect mobility and a high on-off ratio, is normally off, has a clear pinch-off, can realize a larger area, and is replacing a conventional field effect transistor using amorphous silicon.

If the energy band gap is smaller than 2.4 eV, when a visible ray is emitted, electrons in the valence band are excited, conductivity is displayed, and there is the possibility that a leak current is generated easily. To avoid such an inconvenience more effectively, the energy band gap is preferably 2.6 eV or larger, more preferably 2.8 eV or larger, further more preferably 3.0 eV or larger, and particularly preferably 3.2 eV or larger.

The specific resistance of the transparent semiconductor thin film 40 is usually $10^{-1}$ to $10^{+8}$ Ωcm, preferably $10^0$ to $10^{+7}$ Ωcm, more preferably, $10^{+1}$ to $10^{+6}$ Ωcm, further more preferably $10^{+1}$ to $10^{+5}$ Ωcm and, particularly preferably $10^{+2}$ to $10^{+4}$ Ωcm.

The transparent semiconductor thin film 40 is preferably non-degenerate semiconductor thin film. When a degenerate semiconductor is used, it is feared that the carrier concentration cannot be controlled stably to be low.

The non-degenerate semiconductor thin film denotes a semiconductor thin film in which the carrier concentration changes depending on temperature. In contrast, the degenerate semiconductor thin film is a semiconductor thin film in which the carrier concentration has a constant value without depending on the temperature. The temperature dependency of carrier concentration can be obtained from Hall measurement.

The atom ratio (Zn/(Zn+Sn)) between zinc (Zn) and tin (Sn) contained in the semiconductor thin film 50 can be set in the range of 0.40 to 0.95.

When the atom ratio (Zn/(Zn+Sn)) is lower than 0.40 and the content of zinc is small, the valence of tin that exists excessively changes, and it may become difficult to adjust the carrier density. When the temperature at the time of film formation or the temperature of the post process is low, the Hall mobility may decrease.

On the other hand, when the atom ratio (Zn/(Zn+Sn)) becomes higher than 0.95 and the content of zinc becomes excessive, there is the possibility that zinc oxide is partly crystallized, and the properties become nonuniform.

In the embodiment, to avoid the inconvenience more effectively, the atom ratio (Zn/(Zn+Sn)) is preferably 0.51 to 0.95, more preferably 0.67 to 0.93, further more preferably 0.68 to 0.92, and particularly preferably 0.7 to 0.9.

At the time of making zinc oxide and tin oxide contained in the semiconductor thin film 50, preferably, the atom ratio of zinc and tin in all of atoms except for oxygen in the semiconductor thin film 50 is 0.5 or higher. When the ratio is lower than 0.5, a conductive path made of zinc and tin cannot be formed, and the mobility may drop.

To avoid such an inconvenience more effectively, the atom ratio is more preferably 0.7 or higher, further more preferably 0.8 or higher, and particularly preferably 0.9 or higher.

In the transparent semiconductor thin film 40, preferably, a third metallic element other than zinc oxide and tin oxide or a compound of the third metallic element is contained without deteriorating the effects of the embodiment.

The third metallic element [M] is any of group-IIIB (B, Al, Ga, In, and Ti) elements, group-IIIA (Sc and Y) elements, and Lanthanoide series (La, Ce, Pr, Nd, Sm, Eu, Gd, Tb, Dy, Ho, Er, Tm, Yb, and Lu) elements. The content is adjusted so that the atom ratio [M/(M+Zn+Sn)] becomes, preferably, 0 to 0.3, more preferably, 0.0001 to 0.2, and particularly preferably, 0.01 to 0.1.

In the transparent semiconductor thin film 40, preferably, the transmittance of wavelength 550 nm is 75% or higher. If the transmittance of wavelength 550 nm is lower than 75%, when the semiconductor thin film is off to the pixel electrode part, the transmittance decreases. There is the possibility that luminance deteriorates or hue changes. To avoid such an inconvenience more effectively, the transmittance of wavelength 550 nm is preferably 80% or higher and, particularly preferably, 85% or higher.

In the transparent semiconductor thin film 40, preferably, the work function is 3.5 to 6.5 eV. When the work function is smaller than 3.5 eV, there is the possibility that the transistor characteristics deteriorate such as occurrence of charge injection or the like in the interface with the gate insulating film or generation of a leak current. On the other hand, when the work function is larger than 6.5 eV, there is the possibility that the transistor characteristics deteriorate such as occurrence of energy barrier or the like in the interface with the gate insulating film or deterioration in the pinch-off characteristic. To avoid such an inconvenience more effectively, the work function is preferably 3.8 to 6.2 eV, more preferably 4.0 to 6.0 eV, further more preferably 4.3 to 5.7 eV, and particularly preferably 4.5 to 5.5 eV.

In the embodiment, the film forming method for forming the transparent semiconductor thin film 40 is not limited to the chemical film forming method such as spray coating method, the dip coating method, or CVD method but the physical film forming method can also be used. From the viewpoint of easiness of control on the carrier density and improvement in the film quality, the physical film forming method is preferred.

As the physical film forming method, for example, sputtering, vacuum deposition, ion plating, pulse laser deposition, and the like can be mentioned. From the industrial viewpoint, sputtering realizing high mass productivity is preferable.

As the sputtering, for example, DC sputtering, RF sputtering, AC sputtering, ECR sputtering, facing target sputtering, and the like can be mentioned. Among them, DC sputtering and AC sputtering realizing high mass productivity and capable of lowering the carrier concentration more easily than the RF sputtering are preferred from the industrial viewpoint. To suppress degradation in the interface caused by film formation and leak current and to improve the characteristics of the transparent semiconductor thin film 40 such as on-off ratio, ECR sputtering and facing target sputtering in which the film quality can be easily controlled are preferred.

In the case of using sputtering, a sintered target containing zinc oxide may be used or both a sintered target containing zinc oxide and a sintered target containing tin oxide may be used. Reactive sputtering may be performed on a metal target made of zinc or tin or an alloy target while introducing gas such as oxygen.

From viewpoint of reproducibility and uniformity in a large area, it is preferable to use a sintered target containing zinc oxide and tin oxide.

In the case of using a sintered target containing zinc oxide and tin oxide, relative density thereof is usually 75% or higher, preferably 80% or higher, more preferably 85% or higher, further more preferably 90% or higher, and particularly preferably 95% or higher.

The bulk resistance of the sintered target containing zinc oxide and tin oxide is usually 500 Ωcm or less. Further, a preferred sintered target containing zinc oxide and tin oxide includes a spinel crystal expressed as $Zn_2SnO_4$ having an average particle diameter of 20 µm or less.

A sintered target containing zinc oxide and tin oxide sintered usually at 1,150° C. or higher is used. When a target sintered at a temperature lower than 1,150° C. is used, due to large content of oxygen atoms in the target, it is difficult to control the number of oxygen atoms in a sputtering chamber at the time of film formation. There is the possibility that the carrier concentration in the semiconductor thin film is unstable and various.

To avoid such inconveniences more effectively, the sintered target which is sintered at preferably 1,200° C. or higher, more preferably 1,250° C. or higher, and further more preferably 1,300° C. or higher is used.

In the case of using sputtering, the ultimate pressure is usually $5 \times 10^{-2}$ Pa or less. When it is higher than $5 \times 10^{-2}$ Pa, there is the possibility that hydrogen atoms are supplied from $H_2O$ and the like in atmospheric gas, and the Hall mobility decreases.

To avoid such an inconvenience more effectively, the ultimate pressure is preferably $5 \times 10^{-3}$ Pa or less, more preferably $5 \times 10^{-4}$ Pa or less, and particularly preferably $5 \times 10^{-5}$ Pa or less.

The concentration of water $H_2O$ or hydrogen $H_2$ in the atmospheric gas is usually 1.2 vol % or less. When the concentration is higher than 1.2 vol %, there is the possibility that the Hall mobility decreases. The reason is estimated that the hydrogen H disturbs binding of zinc, tin, and oxygen or becomes a scattering factor at the time of moving charges.

To avoid such an inconvenience more effectively, the concentration of water $H_2O$ or hydrogen $H_2$ in the atmospheric gas is preferably 1.0 vol % or less, more preferably 0.1 vol % or less, and particularly preferably 0.01 vol %.

In the case of introducing oxygen for improvement in transmittance (transparency) of the film or the like, the oxygen partial pressure in the atmospheric gas is usually set to $40 \times 10^{-3}$ Pa or less. When the oxygen partial pressure in the atmospheric gas is higher than $40 \times 10^{-3}$ Pa, there is the possibility that the Hall mobility decreases, or the Hall mobility or carrier concentration becomes unstable. The reason is estimated as follows. When oxygen in the atmospheric gas is excessive at the time of film formation, oxygen taken in the crystal lattice increases, and it causes scattering. The oxygen easily leaves the film, and unstableness occurs. To avoid such inconveniences more effectively, the oxygen partial pressure in the atmospheric gas is preferably $15 \times 10^{-3}$ Pa or less, more preferably $7 \times 10^{-3}$ Pa or less, and particularly preferably $1 \times 10^{-3}$ Pa or less.

In such a film formation process, the substrate temperature at the time of film formation is usually set to 25 to 300° C. When the substrate temperature is lower than 25° C., there is the possibility that the specific resistance becomes too high, the field effect mobility at the time of constructing a transistor becomes too low, and the characteristics deteriorate due to heat generation at the time of driving or the ambient temperature. When the substrate temperature is higher than 300° C., there is the possibility that the specific resistance becomes too high, carrier density becomes too high, and the field effect mobility at the time of constructing a transistor becomes too low.

To avoid such inconveniences more effectively, the substrate temperature is preferably 180 to 290° C., more preferably 200 to 270° C.

In the case of forming a film of a large area by sputtering, to provide uniformity in film quality, it is preferable to take a method of rotating a folder to which the substrate is fixed, moving a magnet to widen an erosion range, or the like.

After completion of the film formation process, in the embodiment, preferably, a post process is performed on the thin film containing zinc oxide and tin oxide formed by the physical film forming method so that the temperature of the film surface becomes equal to or higher than the substrate temperature at the time of film formation in the presence of oxygen, the carrier concentration in the transparent semiconductor thin film 40 can be controlled.

At this time, the temperature of the film surface in heat treatment is preferably higher than the substrate temperature at the time of film formation by 100 to 270° C. When the temperature difference is smaller than 100° C., there is no heat treatment effect. When the temperature difference is larger than 270° C., there is the possibility that the substrate deforms, the semiconductor thin film interface deteriorates, and the semiconductor characteristics degrade. To avoid such an inconvenience more effectively, the temperature of the film surface in the heat treatment is higher than the substrate temperature at the time of film formation by, more preferably, 130 to 240° C. and, particularly preferably, 160 to 210° C.

There is also a method of controlling the carrier concentration by controlling concentration of gas components such as oxygen at the time of film formation. In such a method, the Hall mobility may deteriorate. The reason is estimated that the gas components introduced for carrier control are taken in the film and become scattering factors.

As such a post process, an ozone process, heat treatment, laser annealing, or the like can be used without limit. In a preferable process, the film temperature in the presence of oxygen is equal to or higher than the substrate temperature at the time of film formation. Usually, a process is performed so that the temperature becomes 100 to 500° C. When the process temperature is lower than 100° C., there is the possibility that the effect is insufficient. When the process temperature is higher than 500° C., there is the possibility that the substrate is damaged. To avoid such an inconvenience more effectively, the process temperature in the post process is preferably 150 to 400° C. and, particularly preferably, 200 to 290° C.

In the embodiment, the field effect mobility of the thin film transistor 1 is usually set to 10 $cm^2/Vs$ or higher. When the field effect mobility is lower than 10 $cm^2/Vs$, there is the possibility that the switching speed decreases. To avoid such an inconvenience more effectively, the field effect mobility is preferably 13 $cm^2/Vs$ or higher, more preferably 18 $cm^2/Vs$ or higher, further more preferably 30 $cm^2/Vs$ or higher, and particularly preferably 50 $cm^2/Vs$ or higher.

The on-off ratio of the thin film transistor 1 is usually $10^3$ or higher, preferably $10^4$ or higher, more preferably $10^5$ or higher, further more preferably $10^6$ or higher, and particularly preferably $10^7$ or higher.

Preferably, the device is normally off when the threshold voltage (Vth) is positive. If the device is normally on when the threshold voltage (Vth) is negative, the power consumption may increase.

Second Embodiment

A second embodiment of the thin film transistor of the present invention will now be described.

Figure 2:
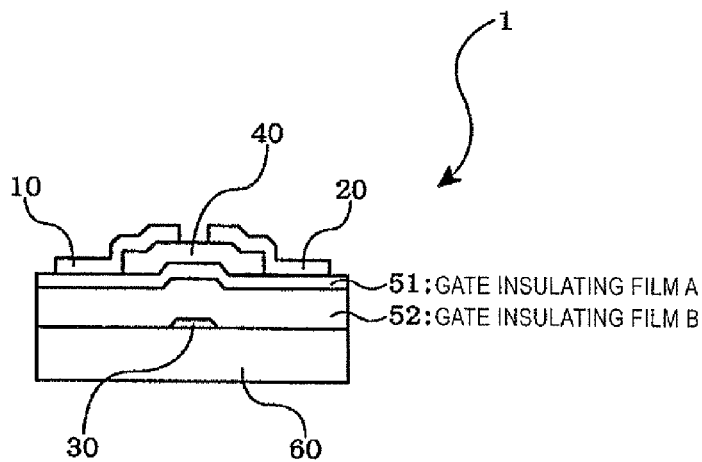
FIG. 2 is an explanatory diagram showing outline of a second embodiment of the thin film transistor according to the invention.

FIG. 2 is an explanatory diagram showing outline of the second embodiment of the thin film transistor according to the present invention.

In the example of the diagram, in the thin film transistor 1, a gate insulating film B 52 and a gate insulating film A 51 are stacked in this order on the gate electrode 30 formed on the glass substrate 60 and, further, the transparent semiconductor thin film 40 is formed on the gate insulating film A 51. On both side parts of the transparent semiconductor thin film 40, the source electrode 20 and the drain electrode 10 are formed. In such a manner, the thin film transistor 1 of the bottom gate type is constructed.

In the foregoing first embodiment, the thin film transistor of the top gate type has been described. It can be a thin film transistor of the bottom gate type as in the second embodiment.

In the thin film transistor of the top gate type as in the first embodiment, there is the case where the surface (interface) of the transparent semiconductor thin film 40 deteriorates when the gate insulating film 50 is formed. To avoid the deterioration, it is preferable to form the thin film transistor of the bottom gate type as in the second embodiment. When a thin film transistor of the bottom gate type as in the second embodiment is used, there is the case that the surface (interface) of a gate insulating film (the gate insulating film A 51) deteriorates due to formation of the transparent semiconductor thin film 40. To avoid the deterioration, it is preferable to form the thin film transistor of the top gate type as in the first embodiment.

Also in the second embodiment, the transparent semiconductor thin film 40 can be formed in a manner similar to the above. The second embodiment is similar to the first embodiment except that the thin film transistor of the bottom gate type is used, so that detailed description of the other configuration will not be repeated.

EXAMPLES

By using concrete examples, the present invention will be described in more detail below.

First Example (1) Manufacture and Evaluation of Sputtering Target

1. Manufacture of Target

As materials, zinc oxide having an average particle diameter of 2.0 μm and tin oxide having an average particle diameter of 0.6 μm were mixed and supplied to a wet ball mill. The materials were mixed and ground for 72 hours to obtain material fine powders.

The obtained material fine powders were granulated and, after that, pressed to a shape having a diameter of 10 cm and a thickness of 5 mm. The resultant was put in a firing furnace and sintered under conditions of 1,400° C. and 48 hours under pressure of oxygen gas, thereby obtaining a sintered body (target). The rate of temperature rise was 3° C./minute.

2. Evaluation of Target

The density of the obtained target was measured. As a result, theoretical relative density was 86%.

(2) Formation of Transparent Semiconductor Thin Film

The sputtering target obtained in (1) was loaded to a film forming apparatus using the DC magnetron sputtering method as one of the DC sputtering methods and a transparent conductive film was formed on a glass substrate (corning 1737).

Sputtering conditions were substrate temperature of 200° C., ultimate pressure of $5\times10^{-5}$ Pa, atmospheric gas Ar of 100%, sputtering pressure (total pressure) of 0.4 Pa, ultimate pressure of $5\times10^{-5}$ Pa, substrate temperature of 200° C., input power of 100 W, and film formation time of 20 minutes.

As a result, a transparent conductive glass in which a transparent conductive oxide having a film thickness of about 100 nm is formed was obtained on the glass substrate.

The film composition obtained was analyzed by ICP method and found that the atom ratio [Zn/(Zn+Sn)] was 0.60 and the atom ratio [Sn/(Zn+Sn)] was 0.40.

(3) Process of Oxidizing Transparent Semiconductor Thin Film

An oxidizing process was performed by heating the transparent semiconductor thin film obtained in (2) in the atmosphere (in the presence of oxygen) at 280° C. for two hours (atmosphere heat treatment).

(4) Evaluation on Properties of Transparent Semiconductor Thin Film

The carrier concentration and Hall mobility of the transparent semiconductor thin film obtained in (3) were measured by a Hall measuring apparatus. The carrier concentration was $1.2\times10^{14}$ cm$^{-3}$ and the Hall mobility was 35 cm$^2$/Vs. The specific resistance value measured by the four terminal method was $1.2\times10^3$ Ωcm.

It was confirmed by X-ray diffraction that the obtained film was an amorphous film.

The Hall measuring apparatus and measurement conditions were as follows.

Hall measuring apparatus: Resi Test8310 (manufactured by TOYO Corporation)

Measurement conditions: AC Hall measurement, measurement temperature 300K, magnetic field 0.45 Tesla Further, light transmittance of the transparent conductive oxide with respect to a light beam having a wavelength of 550 nm measured by a spectro-photometer was 88% and excellent. The energy band gap was 3.3 eV and sufficiently large.

A bottom-gate-type thin film transistor using an SiNx film as a gate insulating film was manufactured by using a semiconductor film similar to the above. A clear pinch-off characteristic was displayed and the transistor was driven stably. A change with time was small.

Examples 2 to 6 and Comparative Examples 1 and 2

Transparent semiconductor thin films were manufactured and evaluated in a manner similar to the example 1 except that the composition ratio of materials, film forming conditions, and oxidizing process conditions were adjusted as shown in Table 1. Table 1 shows the results.

TABLE 1

| | | Examples | | | |
|---|---|---|---|---|---|
| | | 1 | 2 | 3 | 4 |
| Film forming method | | DC magnetron sputtering | DC magnetron sputtering | DC magnetron sputtering | DC magnetron sputtering |
| Film forming parameters | Substrate temperature [° C.] | 200 | 200 | 200 | 200 |
| | Ultimate pressure [×10$^{-5}$ Pa] | 5 | 5 | 100 | 5 |
| | Atmospheric gas | Ar: 100% | Ar: 100% | Ar: 100% | Ar: 100% |
| | Total pressure [Pa] | 0.4 | 0.4 | 0.4 | 0.4 |
| | Oxygen partial pressure [×10$^{-3}$ Pa] | 0 | 0 | 0 | 0 |
| Film composition Atom ratio | Zn/(Zn + Sn) | 0.60 | 0.60 | 0.60 | 0.75 |
| | Sn/(Zn + Sn) | 0.40 | 0.35 | 0.35 | 0.25 |
| | Ga/(Sn + Zn + Ga) | | | 0.05 | 0.05 |
| Oxidizing process | | Atmosphere heat treatment 280° C. 2 hours | Atmosphere heat treatment 280° C. 2 hours | Atmosphere heat treatment 280° C. 2 hours | Atmosphere heat treatment 280° C. 2 hours |
| Characteristics of semiconductor thin film | Crystal property (X-ray diffraction) | amorphous | amorphous | amorphous | amorphous |
| | Hall measurement Carrier density [cm$^{-3}$] | $1.2\times10^{14}$ | $6\times10^{13}$ | $4.5\times10^{15}$ | $4\times10^{13}$ |
| | Hall mobility [cm$^2$/Vs] | 35 | 24 | 18 | 40 |
| | Specific resistance (four-terminal method) [Ωcm] | $1.2\times10^3$ | $1.6\times10^3$ | $7.7\times10^1$ | $3.9\times10^3$ |
| | Energy band gap (eV) | 3.3 | 3.3 | 3.3 | 3.3 |
| TFT characteristic | Driving of TFT | stable | stable | stable | stable |

| | | Examples | | Comparative examples | |
|---|---|---|---|---|---|
| | | 5 | 6 | 1 | 2 |
| Film forming method | | DC magnetron sputtering | DC magnetron sputtering | DC magnetron sputtering | DC magnetron sputtering |
| Film forming parameters | Substrate temperature [° C.] | 25 | 600 | 25 | 25 |
| | Ultimate pressure [×10$^{-5}$ Pa] | 5 | 5 | 10 | 10 |
| | Atmospheric gas | Ar: 100% | Ar: 100% | Ar: 100% | Ar: 100% |

TABLE 1-continued

|  |  | | | | |
|---|---|---|---|---|---|
|  | Total pressure [Pa] | 0.4 | 0.4 | 0.4 | 0.4 |
|  | Oxygen partial pressure [×10$^{-3}$ Pa] | 8 | 16 | 0 | 0 |
| Film composition Atom ratio | Zn/(Zn + Sn) | 0.60 | 0.60 | 1.00 |  |
|  | Sn/(Zn + Sn) | 0.40 | 0.40 |  | 1.00 |
|  | Ga/(Sn + Zn + Ga) |  |  |  |  |
| Oxidizing process |  | none | none | none | none |
| Characteristics of semiconductor thin film | Crystal property (X-ray diffraction) | amorphous | micro-crystalline | poly-crystalline | poly-crystalline |
|  | Hall measurement — Carrier density [cm$^{-3}$] | 4 × 10$^{15}$ | 6 × 10$^{14}$ | 2 × 10$^{18}$ | 2 × 10$^{17}$ |
|  | Hall mobility [cm$^2$/Vs] | 8 | 7 | 2 | 2 |
|  | Specific resistance (four-terminal method) [Ωcm] | 2.0 × 10$^2$ | 1.5 × 10$^3$ | 1.6 × 10$^0$ | 4.0 × 10$^0$ |
|  | Energy band gap (eV) | 3.3 | 3.3 | 3.3 | 3.4 |
| TFT characteristic | Driving of TFT | stable | stable | unstable | unstable |

In the examples 2 and 3, it was confirmed that similar effects were obtained from semiconductor thin films adjusted so that the atom ratio [Ga/(Ga+Zn+Sn)] in the thin film of zinc and tin, in addition, Ga as the third metallic element except for oxygen becomes 0.05.

Comparative Examples 1 and 2

Transparent semiconductor thin films were manufactured and evaluated in a manner similar to the example 1 except that the composition ratio of materials, film forming conditions, and oxidizing process conditions were adjusted as shown in Table 1. Table 1 shows the results.

The present invention has been described by the preferred embodiments. Obviously, the invention is not limited to the foregoing embodiments and can be variously modified in the scope of the invention.

For example, the thin film transistor has been described in the foregoing embodiments. However, the semiconductor thin film according to the invention can be applied to various field effect transistors.

INDUSTRIAL APPLICABILITY

The semiconductor thin film in the present invention can be widely used as a semiconductor thin film used for a field effect transistor such as a thin film transistor.

The invention claimed is:

1. A semiconductor thin film made by an amorphous film containing zinc oxide and tin oxide and whose specific resistance is 10 Ωcm to 10$^7$ Ωcm, wherein the film is a non-degenerate semiconductor thin film having a carrier density of 10$^{+17}$ cm$^{-3}$ or less, a Hall mobility of 2 cm$^2$/V·sec or higher, and an energy band gap of 2.4 eV or more.

2. The semiconductor thin film according to claim 1, wherein atom ratio between zinc [Zn] and tin [Sn] in the amorphous film is expressed as Zn/(Zn+Sn)=0.40 to 0.95.

3. The semiconductor thin film according to claim 1, wherein transmittance of wavelength of 550 nm is 75% or higher.

4. The semiconductor thin film according to claim 1, wherein work function is 3.5 to 6.5 eV.

5. A method of manufacturing a semiconductor thin film according to claim 1, comprising:
   forming an amorphous film containing zinc oxide and tin oxide by a physical film forming method; and
   performing a post process in which temperature in a film surface in the presence of oxygen becomes a temperature equal to or higher than a substrate temperature at the time of the film formation.

6. A thin film transistor comprising the semiconductor thin film according to claim 1.

7. The semiconductor thin film according to claim 1, wherein work function is 4.5 to 5.5 eV.

8. The semiconductor thin film according to claim 1, wherein the film is a non-degenerate semiconductor thin film having a carrier density of 10$^{+14}$ cm$^{-3}$ or less.

9. The semiconductor thin film according to claim 1, wherein the film is a non-degenerate semiconductor thin film having a Hall mobility of 14 cm$^2$/Vs or higher.

10. The semiconductor thin film according to claim 1, wherein the film is a non-degenerate semiconductor thin film having an energy band gap of 3.2 eV or larger.

11. The semiconductor thin film according to claim 1, wherein atom ratio between zinc [Zn] and tin [Sn] in the amorphous film is expressed as Zn/(Zn+Sn)=0.7 to 0.9.

12. The semiconductor thin film according to claim 1, wherein transmittance of wavelength of 550 nm is 85% or higher.

13. The semiconductor thin film according to claim 1, wherein the film is a non-degenerate semiconductor thin film having a carrier density of 10$^{+17}$ to 10$^{+14}$ cm$^{-3}$, a Hall mobility of 2 to 14 cm$^2$/V·sec, and an energy band gap of 2.4 to 3.2 eV.

14. The semiconductor thin film according to claim 13, wherein atom ratio between zinc [Zn] and tin [Sn] in the amorphous film is expressed as Zn/(Zn+Sn)=0.40 to 0.95.

15. The semiconductor thin film according to claim 13, wherein transmittance of wavelength of 550 nm is 75% or higher.

16. The semiconductor thin film according to claim 13, wherein work function is 3.5 to 6.5 eV.

17. The semiconductor thin film according to claim 13, wherein atom ratio between zinc [Zn] and tin [Sn] in the amorphous film is expressed as Zn/(Zn+Sn)=0.7 to 0.9.

18. The semiconductor thin film according to claim 13, wherein transmittance of wavelength of 550 nm is 85% or higher.

19. A thin film transistor comprising the semiconductor thin film according to claim 13.

20. A method of manufacturing a semiconductor thin film according to claim 13, comprising:

forming an amorphous film containing zinc oxide and tin oxide by a physical film forming method; and performing a post process in which temperature in a film surface in the presence of oxygen becomes a temperature equal to or higher than a substrate temperature at the time of the film formation.

* * * * *